US012787714B2

(12) United States Patent
Fulford et al.

(10) Patent No.: US 12,787,714 B2
(45) Date of Patent: Nov. 3, 2026

(54) CONTACTLESS WAFER POSITIONING CARRIER DESIGN

(71) Applicant: Tokyo Electron Limited, Tokyo (JP)

(72) Inventors: Henry Jim Fulford, Marianna, FL (US); Mark I. Gardner, Austin, TX (US); Daniel Fulford, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 251 days.

(21) Appl. No.: 18/812,374

(22) Filed: Aug. 22, 2024

(65) Prior Publication Data

US 2026/0060040 A1 Feb. 26, 2026

(51) Int. Cl.

| | |
|---|---|
| ***H10P 72/78*** | (2026.01) |
| ***H01F 7/20*** | (2006.01) |
| ***H10P 72/50*** | (2026.01) |
| *H01F 7/02* | (2006.01) |
| *H10P 72/76* | (2026.01) |

(52) U.S. Cl.

CPC .............. *H10P 72/78* (2026.01); *H10P 72/50* (2026.01); *H01F 7/0247* (2013.01); *H01F 7/20* (2013.01); *H10P 72/7602* (2026.01)

(58) Field of Classification Search

CPC ...... H10P 72/78; H10P 72/50; H10P 72/3204; H10P 72/57; H10P 72/72; H10P 72/722; H10P 72/70; G03F 7/707; G03F 7/70716; G03F 7/70708; C23C 14/50

See application file for complete search history.

(56) References Cited

FOREIGN PATENT DOCUMENTS

| | | | | |
|---|---|---|---|---|
| EP | 1 119 028 B1 | 8/2010 | | |
| JP | 2020-503663 A | 1/2020 | | |
| KR | 10-2020-0051884 A | 5/2020 | | |
| KR | 10-2021-0107599 A | 9/2021 | | |
| KR | 10-2021-0157158 A | 12/2021 | | |
| KR | 20210157158 A | * | 12/2021 | ........... B23K 26/702 |
| WO | WO-2019101319 A1 | * | 5/2019 | .......... H10P 72/3204 |

OTHER PUBLICATIONS

English translation KR20210157158 (Year: 2021).*

International Search Report and Written Opinion issued Nov. 18, 2025 in PCT/US2025/038288, 8 pgs.

* cited by examiner

*Primary Examiner* — Sunil K Singh

*Assistant Examiner* — Amanda Kreiling

(74) *Attorney, Agent, or Firm* — Oblon, McClelland, Maier & Neustadt, L.L.P.

(57) ABSTRACT

A method of wafer handling includes providing a wafer on a wafer carrier on a wafer chuck on a vacuum plate. The wafer carrier includes a permanent magnet. The wafer chuck includes an electromagnet. The wafer is raised against a gravity direction by flowing an electrical current through the electromagnet so that the wafer carrier is repelled from the wafer chuck while the wafer remains on the wafer carrier. While keeping the wafer raised, wafer alignment is adjusted by moving the wafer chuck, the wafer carrier or both. The electrical current is reduced to zero so that the wafer carrier contacts the wafer chuck. The wafer is connected to the vacuum plate via a first vacuum cavity of the wafer chuck and a third vacuum cavity of the wafer carrier. The wafer carrier is connected to the vacuum plate via the second vacuum cavity of the wafer chuck.

20 Claims, 9 Drawing Sheets

CONTACTLESS WAFER POSITIONING CARRIER DESIGN

FIELD OF THE INVENTION

This disclosure relates to microelectronic devices and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a wafer which needs to be aligned for pattern fidelity. Typically, wafer alignment is executed and accomplished while the wafer sits or rests on a wafer chuck.

SUMMARY

The present disclosure relates to a method of wafer handling and a wafer handling apparatus.

According to a first aspect of the disclosure, a method of wafer handling is provided. The method includes providing a wafer, a wafer carrier, a wafer chuck and a vacuum plate. The wafer is on the wafer carrier. The wafer carrier is on the wafer chuck. The wafer chuck is on the vacuum plate. The wafer carrier includes a permanent magnet. The wafer chuck includes an electromagnet. The wafer chuck includes a first vacuum cavity and a second vacuum cavity. The wafer carrier includes a third vacuum cavity. While a vacuum for the first vacuum cavity, the second vacuum cavity and the third vacuum cavity is off, the wafer is raised against a gravity direction by flowing an electrical current through the electromagnet so that the wafer carrier is repelled from the wafer chuck while the wafer remains on the wafer carrier. While keeping the wafer raised, wafer alignment is adjusted by moving the wafer chuck, the wafer carrier or both so that the first vacuum cavity and the third vacuum cavity are aligned with each other. The electrical current is reduced to zero so that the wafer carrier is in contact with the wafer chuck. The wafer is connected to the vacuum plate via the first vacuum cavity and the third vacuum cavity. The wafer carrier is connected to the vacuum plate via the second vacuum cavity.

In some embodiments, the first vacuum cavity and the second vacuum cavity include through-holes that extend through the wafer chuck. The third vacuum cavity includes a through-hole that extends through the wafer carrier.

In some embodiments, an overall area of the first vacuum cavity and the second vacuum cavity in a horizontal plane substantially perpendicular to a thickness direction of the wafer chuck is larger than an overall area of the third vacuum cavity in the horizontal plane.

In some embodiments, the first vacuum cavity and the second vacuum cavity are not connected with each other.

In some embodiments, the first vacuum cavity and the second vacuum cavity are part of a stripe pattern and connected with each other.

In some embodiments, the vacuum for the first vacuum cavity, the second vacuum cavity and the third vacuum cavity is switched on so that the wafer, the wafer carrier, the wafer chuck and the vacuum plate are held together by the vacuum.

In some embodiments, the wafer is rotated by a robot gripper so that a working surface of the wafer is not perpendicular to the gravity direction.

In some embodiments, the wafer is rotated so that the working surface of the wafer is parallel to the gravity direction.

In some embodiments, another electrical current is flowed through the electromagnet so that the wafer carrier is magnetically attracted to the wafer chuck.

In some embodiments, the wafer carrier further includes a dielectric enclosure, and the permanent magnet is embedded in the dielectric enclosure.

In some embodiments, the wafer carrier further includes wafer pins outside the dielectric enclosure.

According to a second aspect of the disclosure, apparatus is provided. The apparatus includes a wafer chuck. The wafer chuck includes an electromagnet and is configured to receive a wafer carrier thereon. The wafer carrier includes a permanent magnet and is configured to receive a wafer thereon. The wafer chuck includes a first vacuum cavity and a second vacuum cavity. The wafer carrier includes a third vacuum cavity. The apparatus also includes a vacuum plate below the wafer chuck. The wafer is configured to connect to the vacuum plate via the first vacuum cavity and the third vacuum cavity. The wafer carrier is configured to connect to the vacuum plate via the second vacuum cavity. The apparatus further includes a controller that is configured to, while a vacuum for the first vacuum cavity, the second vacuum cavity and the third vacuum cavity is off, raise the wafer against a gravity direction by flowing an electrical current through the electromagnet so that the wafer carrier is repelled from the wafer chuck while the wafer remains on the wafer carrier.

In some embodiments, the first vacuum cavity and the second vacuum cavity include through-holes that extend through the wafer chuck. The third vacuum cavity includes a through-hole that extends through the wafer carrier.

In some embodiments, an overall area of the first vacuum cavity and the second vacuum cavity in a horizontal plane substantially perpendicular to a thickness direction of the wafer chuck is larger than an overall area of the third vacuum cavity in the horizontal plane.

In some embodiments, the first vacuum cavity and the second vacuum cavity are not connected with each other.

In some embodiments, the first vacuum cavity and the second vacuum cavity are part of a stripe pattern and connected with each other.

In some embodiments, the wafer carrier further includes a dielectric enclosure, and the permanent magnet is embedded in the dielectric enclosure.

In some embodiments, the wafer carrier further includes wafer pins outside the dielectric enclosure.

In some embodiments, a robotic gripper that is configured to rotate the wafer so that a working surface of the wafer is not perpendicular to the gravity direction.

In some embodiments, the controller is further configured to move the wafer chuck to adjust wafer alignment while keeping the wafer raised, before reducing the electrical current to lower the wafer along the gravity direction.

In some embodiments, the controller is further configured to move the wafer chuck to adjust wafer alignment while keeping the wafer raised, before reducing the electrical current to lower the wafer along the gravity direction.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1A:
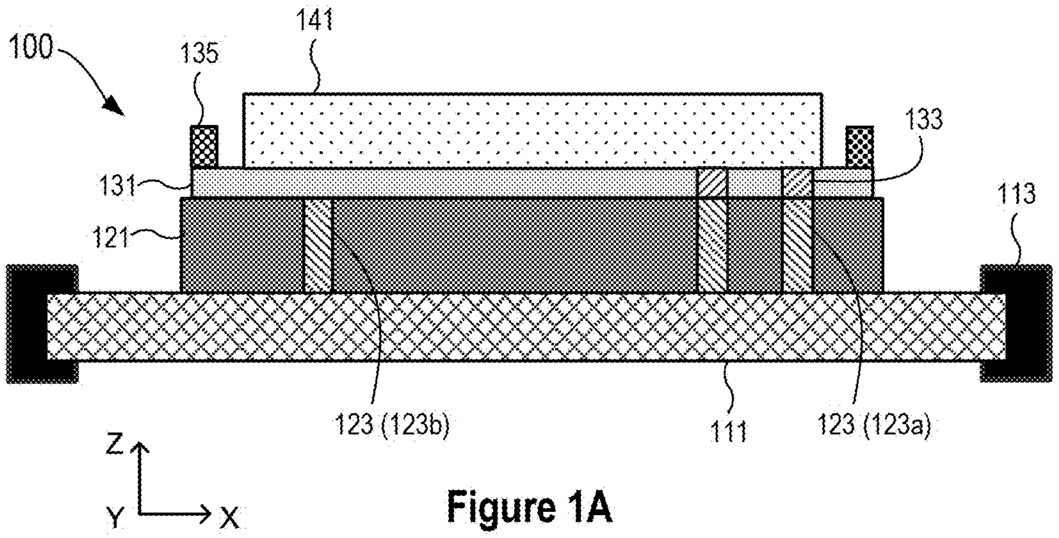
FIG. 1A shows a vertical cross-sectional view of a wafer handling system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

In the drawings, like reference numerals designate identical or corresponding parts throughout the several views. Additionally, as used herein, the words "a", "an" and the like generally carry a meaning of "one or more", unless stated otherwise.

Furthermore, the terms, "approximately", "approximate", "about" and similar terms generally refer to ranges that include the identified value within a margin of 20%, 10%, or preferably 5%, and any values therebetween.

A numerical range represented by "to" includes numerical values at both ends, unless specified otherwise.

As noted in the Background, wafer alignment is typically executed and accomplished while the wafer is placed on a wafer chuck and moved around to adjust the wafer position by some aligners. Therefore, there is some contact between the wafer and the aligners and/or between the wafer and the wafer chuck.

Techniques herein provide a contactless wafer positioning carrier design that can levitate a wafer using a metal base wafer platform (enclosed in a dielectric shell) as a wafer carrier. Then, when subjected to an electromagnet force, the wafer can be levitated from the wafer chuck as one option or may be attracted to the wafer chuck as another option to lock the wafer into position. Additional options include a vacuum cavity built into the wafer chuck to further secure the wafer to enable various wafer orientations. One vacuum system can be utilized from the wafer chuck to a base vacuum plate. Another vacuum system can be utilized from the wafer chuck through the wafer carrier allowing access to the back surface of the wafer.

Techniques herein include a magnetic wafer levitation system integrated with a vacuum cavity. In one embodiment, magnetic repulsion from the bottom surface is enabled by an elevated wafer displacement carrier tool design integrated with air chuck cavity. In another embodiment, fine wafer alignment can be achieved when the wafer is elevated. As a result, wafer transport system wear and reliability can be reduced or even eliminated.

According to aspects of the present disclosure, the wafer carrier holder includes a metal that is encased in a dielectric shell, thus allowing for attraction or repulsion of the wafer to the wafer chuck (or plater holder) when the electromagnet field is turned on with one current flow or opposite current flow in the electromagnet. Sensors can be inserted under the wafer as the wafer is elevated off the wafer chuck. When the wafer is levitated, various semiconductor processing steps can be enabled such as a fine alignment by moving the (base) wafer chuck or platform. Such wafer elevation also allows the wafer to be held in place using the dual vacuum cavities when the fine alignment is achieved.

Techniques herein provide a fine alignment tool design with robotic artificial intelligence (AI) movement, which enables a tool configuration that provides a base wafer plate that can move in the lateral (e.g. X, Y) and angular (e.g. θ) directions and also a robot gripper that can move the wafer surface also in the lateral (e.g. X, Y) and angular (e.g. θ) directions as options in close proximity to the base plate. This fine alignment tool design allows the robot gripper to make the fine alignment by moving the wafer relative to the base wafer plate, or the wafer may remain fixed while the base wafer plate may be moved for precision fine alignment. Alternatively, both the wafer and the base wafer plate may be moved for alignment. Accordingly, at least three tool platforms can be enabled that may move the wafer stage independently, move the wafer independently or move the wafer stage and the wafer in tandem platform movement.

Techniques herein can solve the essential fine alignment tool concern that is essential to obtain precision alignment using a wafer chuck design or wafer plate stage that can move in the lateral (e.g. X, Y) and angular (e.g. θ) directions when the wafer is elevated (i.e. using the aforementioned fine alignment tool design with robotic AI movement) in a (fixed) distance from the movable stage. In some embodiments, the wafer is constantly monitored, and the wafer plate and the robot gripper are also constantly monitored throughout the fine alignment step sequence using an integrated feature of integrating AI for the robot gripper, integrating AI for the wafer plate, and integrating AI for continuous monitoring.

Figure 1B:
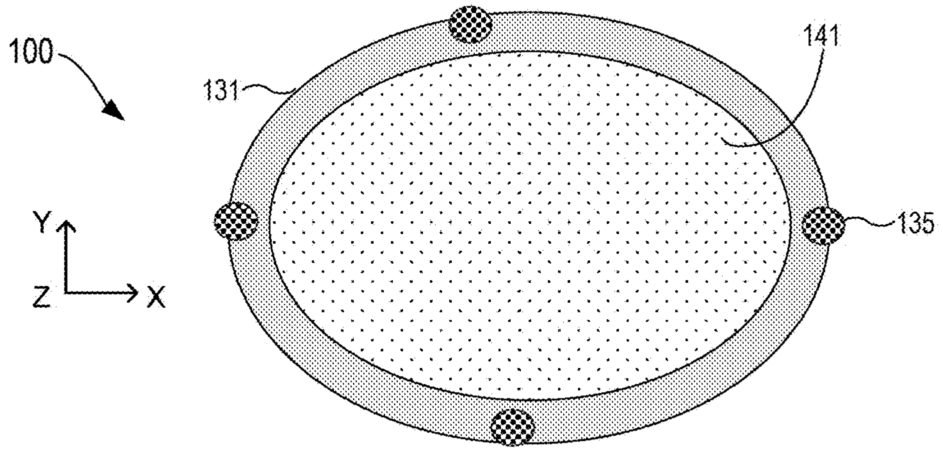
FIG. 1B shows a top-down view of a wafer handling system in accordance with some embodiments of the present disclosure.
Figure 1C:
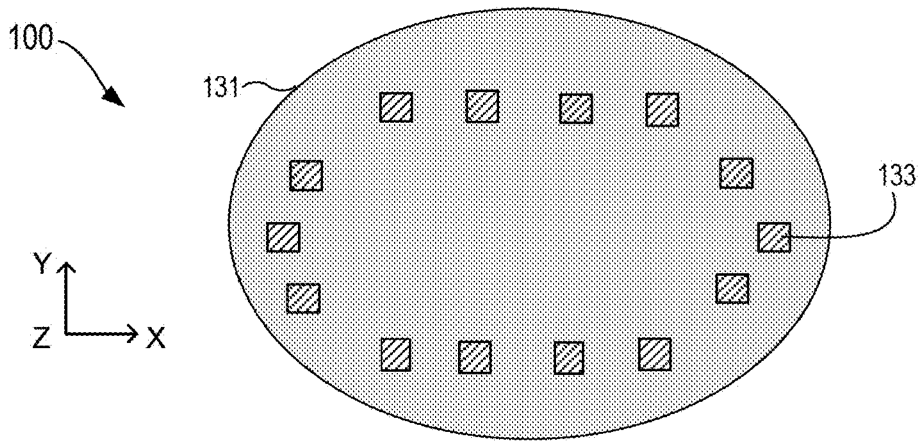
FIG. 1C shows a bottom-up view of a wafer carrier in accordance with some embodiments of the present disclosure.

FIGS. 1A, 1B and 1C respectively show a vertical cross-sectional view, a top-down view and a bottom-up view of a wafer handling system (hereinafter referred to as a system 100) in accordance with some embodiments of the present disclosure. As shown, the system 100 includes a base vacuum plate 111 and optionally one or more robot grippers 113 installed on ends or edges of the base vacuum plate 111. A wafer chuck 121 is placed on the base vacuum plate 111. A wafer carrier 131 can be placed on the wafer chuck 121. A wafer 141 can be placed on the wafer carrier 131.

The wafer chuck 121 can include an electromagnet embedded therein. The wafer carrier 131 can include a permanent magnet. When the electromagnet is in an OFF state, meaning that there is no electrical current flowing through the electromagnet, there is no magnetic force between the wafer chuck 121 and the wafer carrier 131. When the electromagnet is in an ON state, meaning that there is an electrical current flowing through the electromagnet, a magnetic force is generated between the wafer chuck 121 and the wafer carrier 131. The magnetic force can be repulsive or attractive, depending on the direction of the electrical current and the magnetic polarity placement of the permanent magnet. When the magnetic force is repulsive, the wafer carrier 131 can be repelled from the wafer chuck 121 while the wafer 141 remains on the wafer carrier 131. As a result, the wafer 141 can be raised or elevated in the +Z direction (e.g. against a gravity direction).

The wafer chuck 121 can include vacuum cavities 123 such as one or more first vacuum cavities 123*a* and one or more second vacuum cavities 123*b* while the wafer carrier 131 can include one or more third vacuum cavities 133. The first vacuum cavities 123*a* in an electromagnet region can be aligned and/or directly connected with the third vacuum cavities 133 on a back surface of the wafer region. The second vacuum cavities 123*b* are not aligned or directly connected with any of the third vacuum cavities 133. As a result, the wafer chuck 121 and the wafer carrier 131 can be held in place by vacuum to the base vacuum plate 111 when the vacuum is turned on during some operation.

Shapes of the first vacuum cavities 123*a*, the second vacuum cavities 123*b* and the third vacuum cavities 133 are not particularly limited and can for example include through-holes and/or channels. Lateral dimensions in the XY plane of the first vacuum cavities 123*a* and the third vacuum cavities 133 are not particularly limited. Preferably, a lateral dimension of the third vacuum cavities 133 can be identical to or smaller than a lateral dimension of the first vacuum cavities 123*a*. When viewed from the Z direction, an overall area of the first vacuum cavities 123*a* and the second vacuum cavities 123*b* in the XY plane is preferably larger than an overall area of the third vacuum cavities 133 in the XY plane.

Additionally, the wafer carrier 131 can include a plurality of (e.g. three or more) wafer pins 135 used to hold the wafer 141 in place. For instance, the wafer pins 135 can be installed around edges of the wafer carrier 131 to prevent the wafer 141 from moving out of or falling off the wafer carrier 131.

The base vacuum plate 111 can be configured to move laterally (e.g. in the X and/or Y directions) and rotated in the XY plane with continuous alignment measurement. The one or more robot grippers 113 can rotate the base vacuum plate 111 in the XZ plane and/or the YZ plane.

In one embodiment, the vacuum for the first vacuum cavities 123*a*, the second vacuum cavities 123*b* and the third vacuum cavities 133 is in an OFF state. The electromagnet of the wafer chuck 121 is in an OFF state. As a result, the wafer 141, the wafer carrier 131, the wafer chuck 121 and the base vacuum plate 111 rest on top of each other by gravity. In another embodiment, the vacuum for the first vacuum cavities 123*a*, the second vacuum cavities 123*b* and the third vacuum cavities 133 is in an ON state. The electromagnet of the wafer chuck 121 is in an OFF state. As a result, the wafer 141, the wafer carrier 131, the wafer chuck 121 and the base vacuum plate 111 are held together by the vacuum. In yet another embodiment, the vacuum for the first vacuum cavities 123*a*, the second vacuum cavities 123*b* and the third vacuum cavities 133 is in an OFF state. The electromagnet of the wafer chuck 121 is in an ON state. As a result, the wafer carrier 131 and the wafer chuck 121 are held together by an attractive magnetic force. In yet another embodiment, the vacuum for the first vacuum cavities 123*a*, the second vacuum cavities 123*b* and the third vacuum cavities 133 is in an ON state. The electromagnet of the wafer chuck 121 is in an ON state. As a result, the wafer 141, the wafer carrier 131, the wafer chuck 121 and the base vacuum plate 111 are held together by the vacuum, in addition to the attractive magnetic force.

Note that the wafer 141, the wafer carrier 131, the wafer chuck 121 and the base vacuum plate 111 are removably placed on top of each other or stacked in the Z direction during some operations. During other operations or a non-operation, one or more of the wafer 141, the wafer carrier 131, the wafer chuck 121 and the base vacuum plate 111 can be physically separated from each other e.g. not being in direct contact with each other.

Figure 2A:
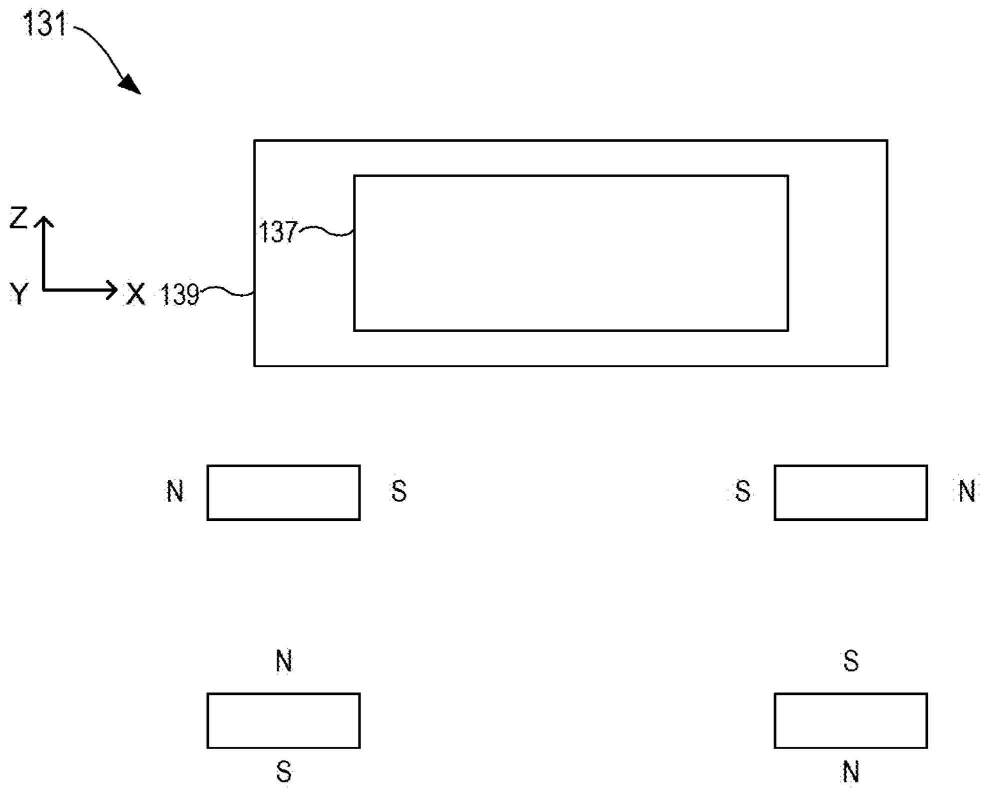
FIG. 2A shows a vertical cross-sectional view of a wafer carrier and magnetic polarity configurations in accordance with some embodiments of the present disclosure.

FIG. 2A shows a vertical cross-sectional view of the wafer carrier 131 and magnetic polarity configurations in accordance with some embodiments of the present disclosure. The wafer carrier 131 can include a metal core 137 embedded in a dielectric shell 139. The metal core 137 can include a permanent magnet such as a natural magnet (e.g. magnetite) and an artificial magnet (e.g. alnico). Examples of the permanent magnet include, but are not limited to, an aluminum-nickel-cobalt magnet, a strontium-iron magnet (ferrite and ceramics), a neodymium-iron-boron magnet (neodymium magnets) and a samarium-cobalt magnet.

The orientation of the magnetic field generated by the permanent magnet can be in any direction and is not particularly limited. In some embodiments, the north pole and the south pole of the metal core 137 can be horizontally oriented, e.g. one pole facing the +X direction and the other pole facing the −X direction. In some embodiments, the north pole and the south pole of the metal core 137 can be vertically oriented, e.g. one pole facing the +Z direction and the other pole facing the −Z direction.

While only one metal core is shown in the example of FIG. 2A, it should be understood that a plurality of or any number of metal cores can be embedded in the dielectric shell 139.

Figure 2B:
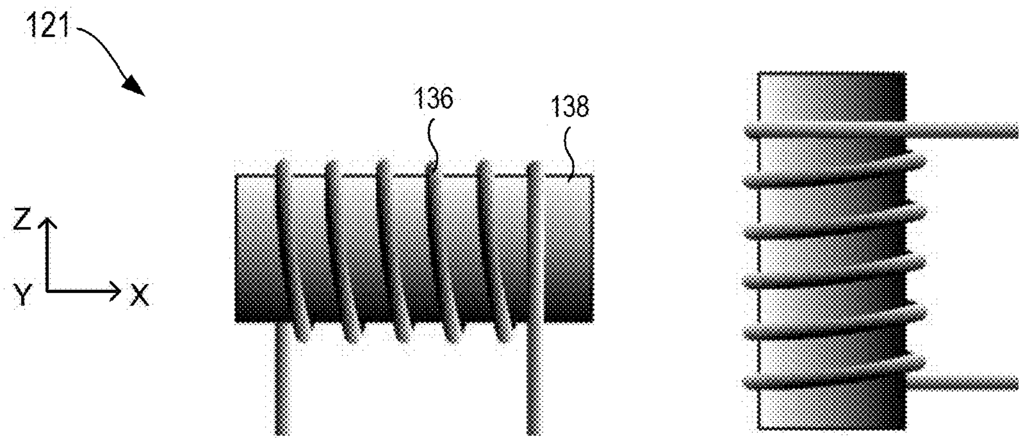
FIG. 2B shows schematics of electromagnets in accordance with some embodiments of the present disclosure.

FIG. 2B shows schematics of electromagnets in accordance with some embodiments of the present disclosure. As mentioned earlier, the wafer chuck 121 can include an electromagnet embedded or built therein. The electromagnet can for example be in the form of a coiled wire or a solenoid 136 wrapped around a plunger 138 (e.g. iron). The orientation of the coiled wire is not particularly limited and may depend on the orientation of the magnetic field of the wafer carrier 131. For example, when the north pole and the south pole of the metal core 137 are horizontally oriented, the north pole and the south pole of the wafer chuck 121 can also be horizontally oriented. When the north pole and the south pole of the metal core 137 are vertically oriented, the north pole and the south pole of the wafer chuck 121 can also be vertically oriented.

Figure 3:
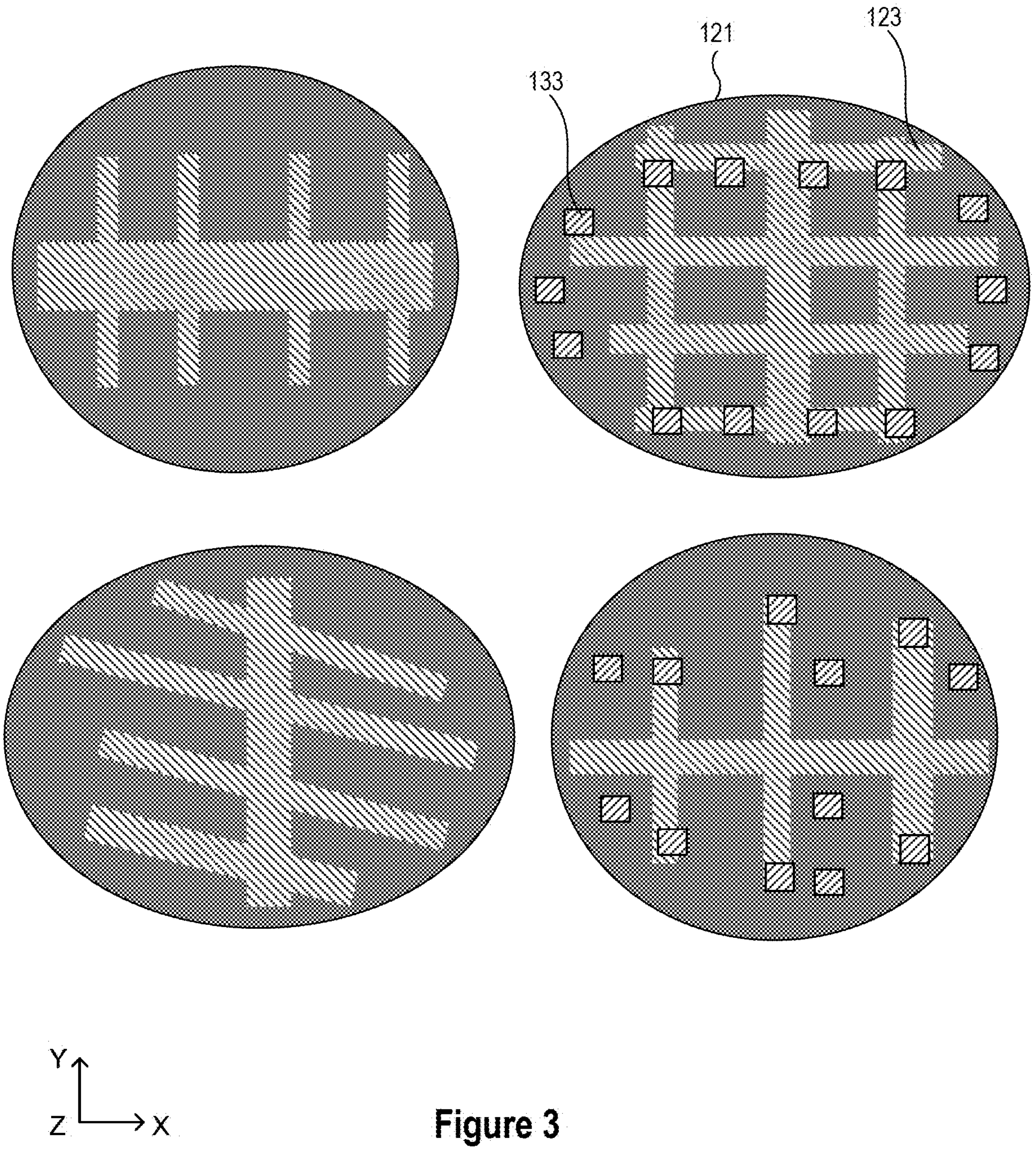
FIG. 3 shows schematics of wafer chuck designs in accordance with some embodiments of the present disclosure.
Figure 4:
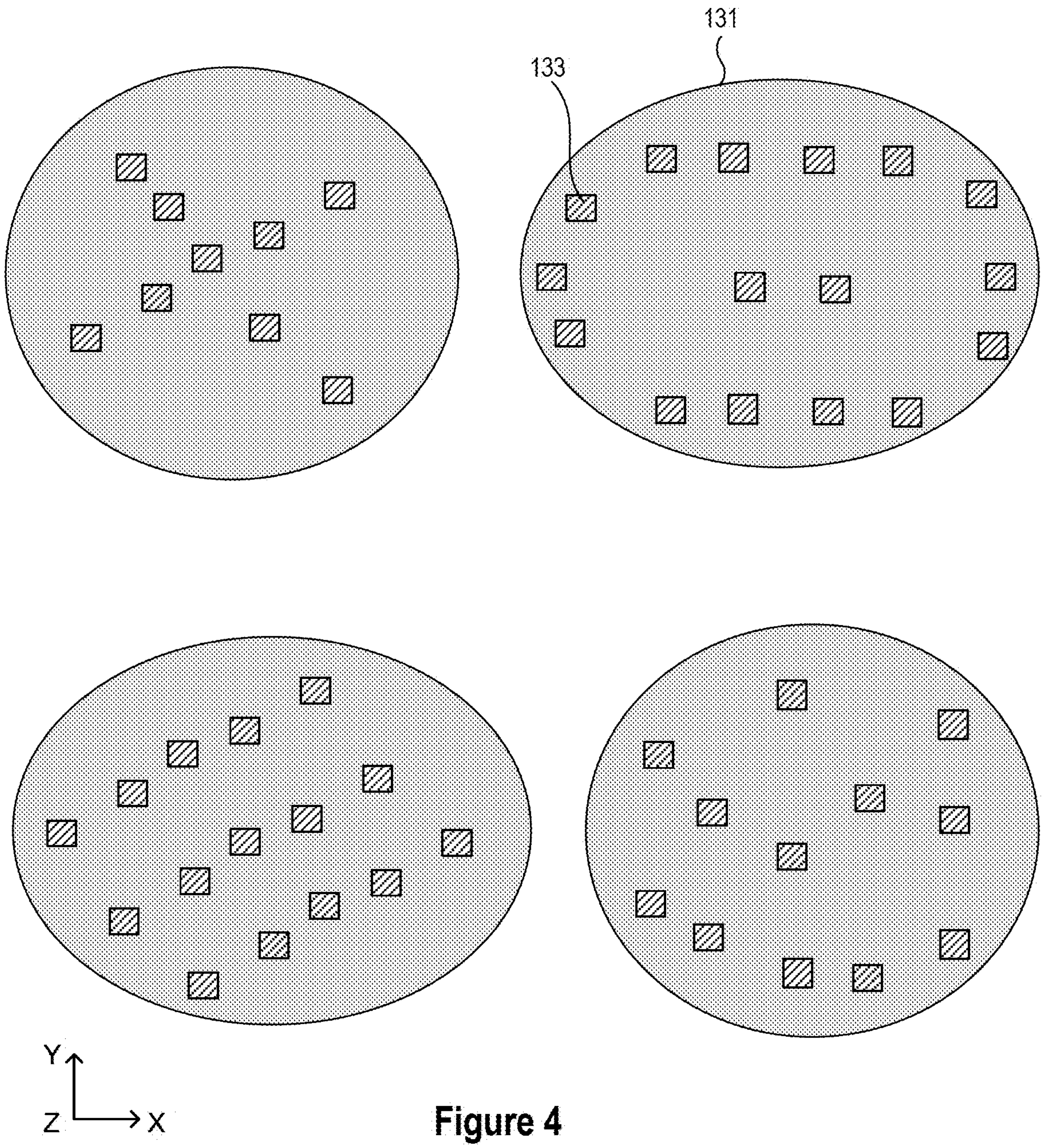
FIG. 4 shows schematics of wafer carrier designs in accordance with some embodiments of the present disclosure.

FIG. 3 shows some schematic designs of the wafer chuck 121, and FIG. 4 shows some schematic designs of the wafer carrier 131 in accordance with some embodiments of the present disclosure. As mentioned earlier, some of the first vacuum cavities 123*a* can be aligned and/or connected with some of the third vacuum cavities 133. The vacuum cavities 123 can have a pattern of stripes that may overlap with some of the third vacuum cavities 133. Accordingly, the first vacuum cavities 123*a* and the second vacuum cavities 123*b*, while shown to be separate from each other in a vertical cross-section in FIG. 1A, may or may not be connected through the pattern of stripes. For instance, the first vacuum cavities 123*a* and the second vacuum cavities 123*b* can both be part of the pattern of stripes. Additionally, while an overall area of the vacuum cavities 123 in the XY plane is preferably larger than an overall area of the third vacuum cavities 133 in the XY plane, the number of the vacuum cavities 123 (or stripes) can be smaller than the number of the third vacuum cavities 133. The schematic designs herein are shown merely for illustrative purposes and are not limiting. For instance, the third vacuum cavities 133, while not located in the wafer chuck 121, are shown herein to show relative positions with regard to the pattern of stripes.

Figure 5:
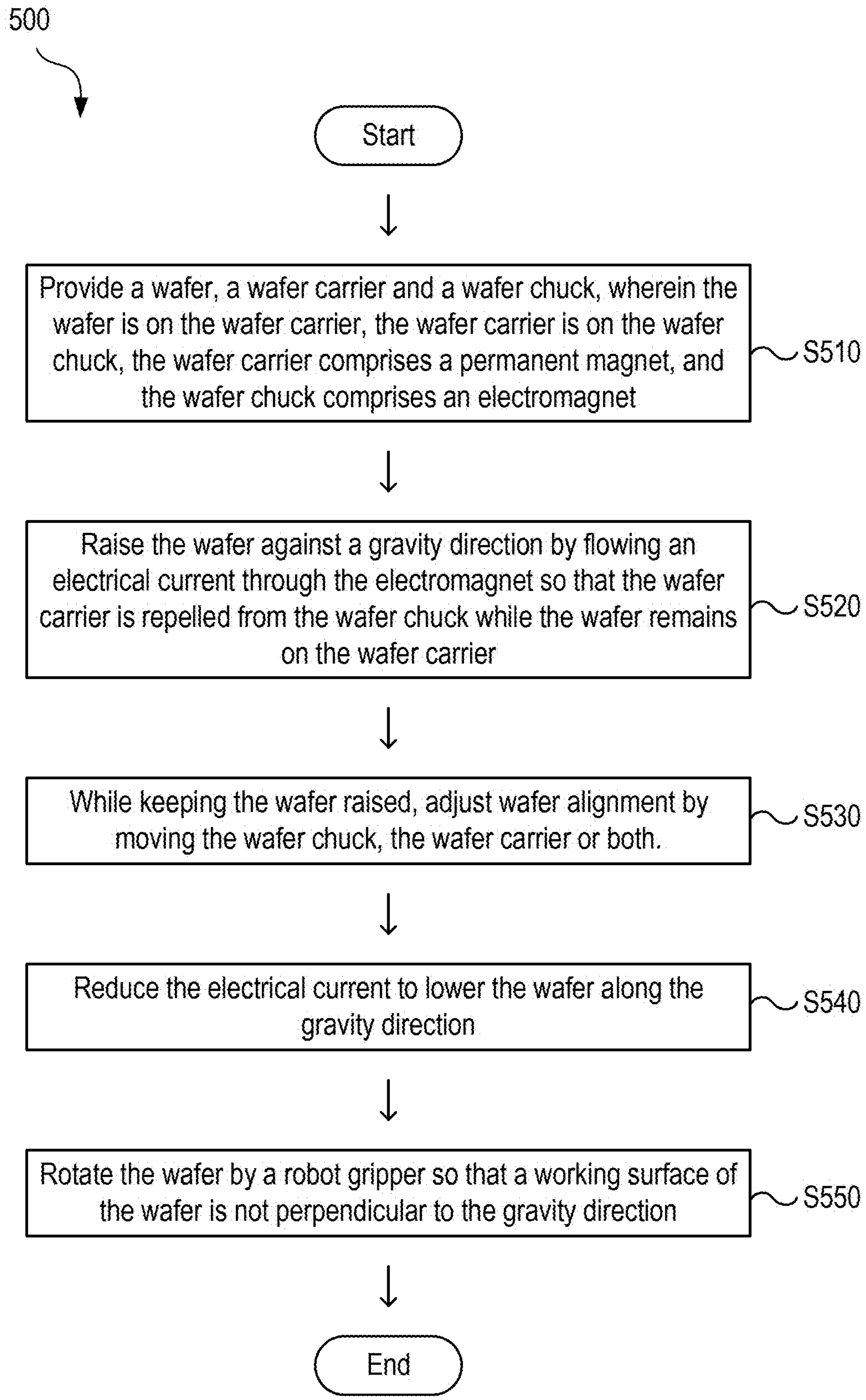
FIG. 5 shows a flow chart of a process for handling a wafer, in accordance with some embodiments of the present disclosure.

FIG. 5 shows a flow chart of a process 500 for handling a wafer, in accordance with some embodiments of the present disclosure. At step S510, a wafer, a wafer carrier and a wafer chuck are provided. The wafer is on the wafer carrier. The wafer carrier is on the wafer chuck. The wafer carrier includes a permanent magnet, and the wafer chuck includes an electromagnet. At step S520, the wafer is raised against a gravity direction by flowing an electrical current through the electromagnet so that the wafer carrier is repelled from the wafer chuck while the wafer remains on the wafer carrier. At step S530, while keeping the wafer raised, wafer alignment is adjusted by moving the wafer chuck, the wafer carrier or both. At step S540, the electrical current is reduced to lower the wafer along the gravity direction. At step S550, the wafer is rotated by a robot gripper so that a working surface of the wafer is not perpendicular to the gravity direction.

Figure 6:
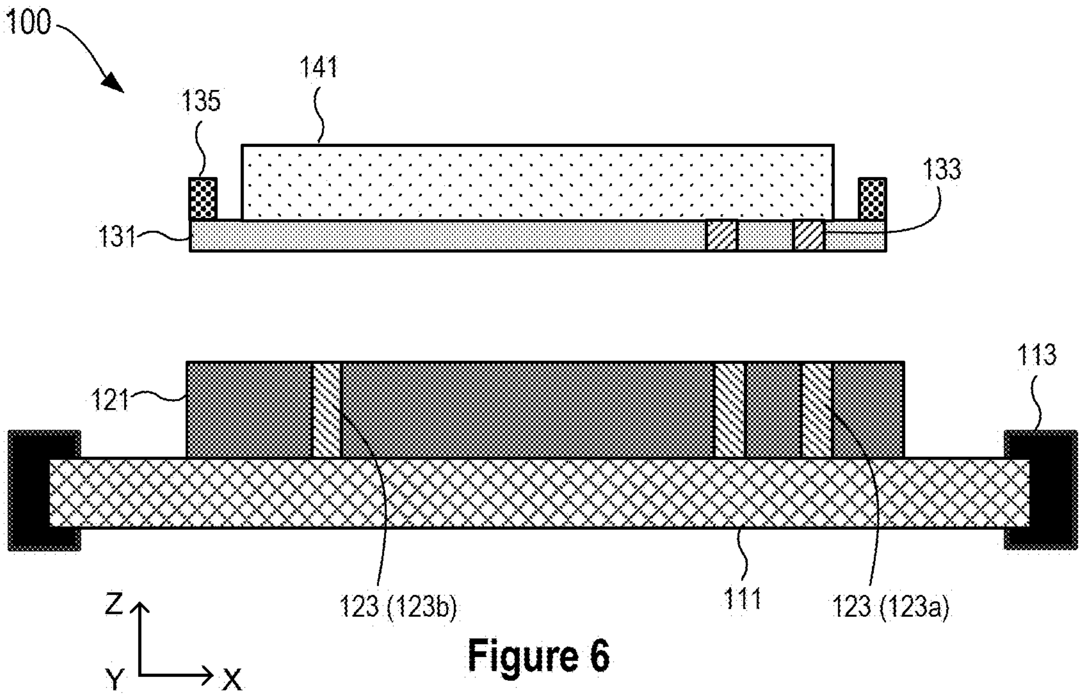
FIGS. 6, 7, 8, 9, 10 and 11 show vertical cross-sectional views of a wafer handling system at various intermediate steps of handling a wafer, in accordance with some embodiments of the present disclosure.

FIGS. 6, 7, 8, 9, 10 and 11 show vertical cross-sectional views of the system 100 at various intermediate steps of handling a wafer, in accordance with some embodiments of the present disclosure. In FIG. 6, the wafer 141 is placed, installed or mounted on the wafer carrier 131 while the wafer carrier 131 is physically separated from the wafer chuck 121.

Figure 7:
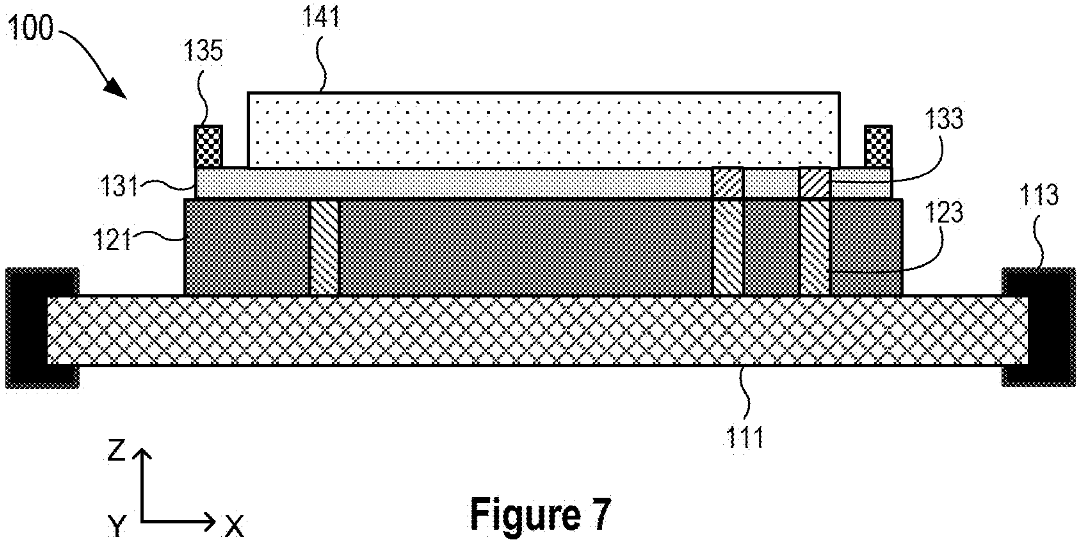

In FIG. 7, the wafer carrier 131 is placed, installed or mounted on the wafer chuck 121. The electromagnet of the wafer chuck 121 is in the aforementioned OFF state. The vacuum is also off so that the wafer carrier 131 rests on the wafer chuck 121 by gravity e.g. in the −Z direction. The base vacuum plate 111 has the ability to rotate in X, Y and angle positions. In alternative embodiments, the wafer carrier 131 can be placed on the wafer chuck 121 before the wafer 141 is placed on the wafer carrier 131.

Figure 8:
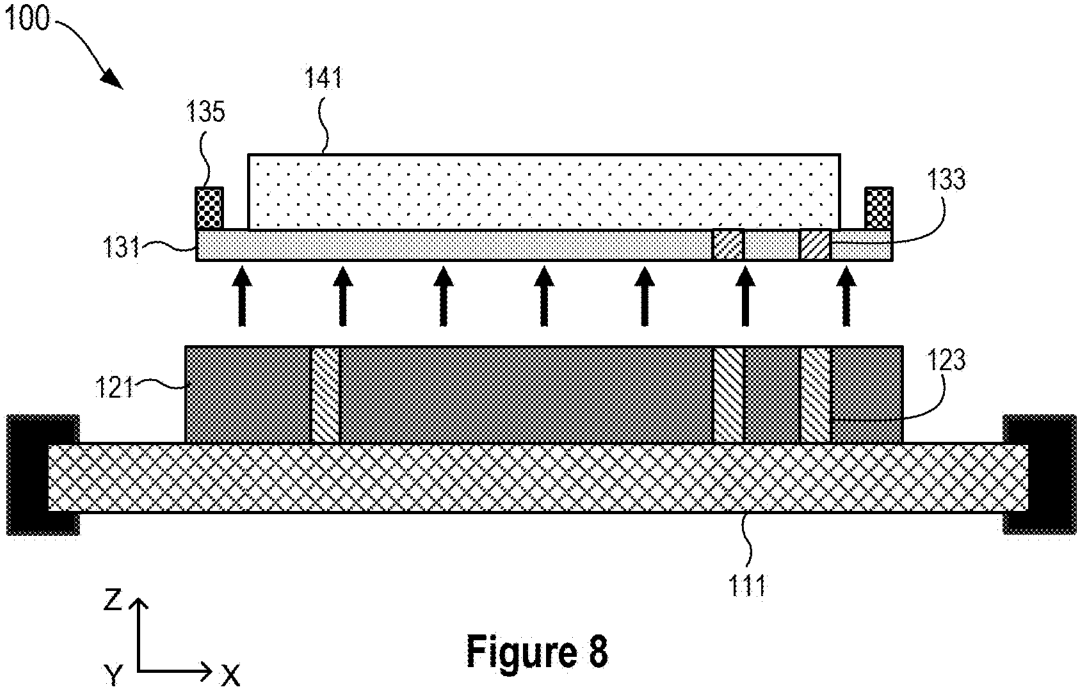

In FIG. 8, the electromagnet of the wafer chuck 121 is switched to the aforementioned ON state by flowing an electrical current through the electromagnet. The vacuum is off. As a result, a repulsive magnetic force can be generated between the wafer carrier 131 and the wafer chuck 121 so that the wafer carrier 131 is repelled from the wafer chuck 121 against the gravity direction or along the +Z direction. Consequently, the wafer 141 is elevated in the +Z direction. By adjusting the electrical current, the repulsive magnetic force can be precisely controlled so a distance D between the wafer carrier 131 and the wafer chuck 121 can be precisely determined or controlled.

Figure 9:
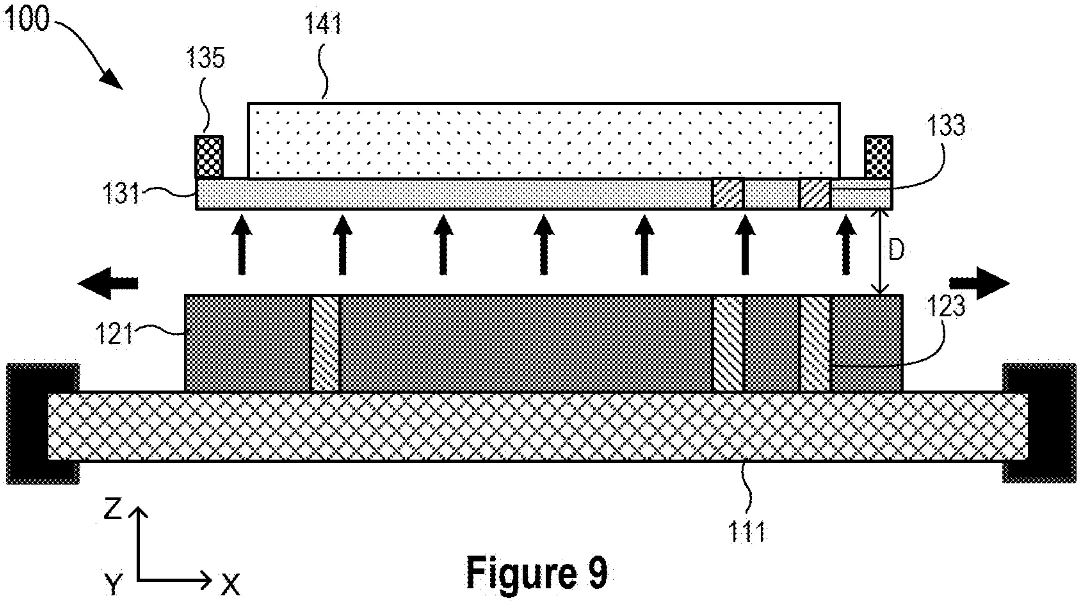

In FIG. 9, while keeping the wafer 141 and the wafer carrier 131 elevated or levitated, the wafer chuck 121 and/or the base vacuum plate 111 can be moved laterally (e.g. in the X and/or Y directions) and/or rotated (e.g. in the XY plane) with continuous alignment measurement on to obtain the desired fine alignment. Such lateral movement and/or rotation can be achieved for example using a controller 250 as will be explained in detail later in FIGS. 12 and 13.

Alternatively or additionally, the wafer carrier 131 can be moved laterally (e.g. in the X and/or Y directions) and/or rotated (e.g. in the XY plane) to adjust wafer alignment. Similarly, such lateral movement and/or rotation can be achieved for example using the controller 250 as will be explained in detail later in FIGS. 12 and 13.

Figure 10:
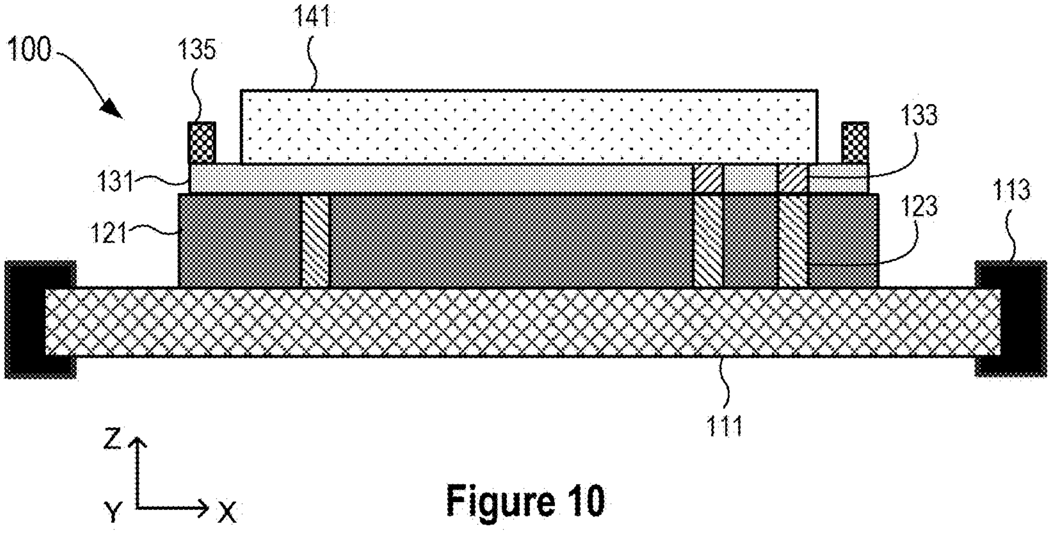

In FIG. 10, the electrical current through the electromagnet can be gradually reduced to lower the wafer 141 along the gravity direction or in the −Z direction. The electrical current can eventually be reduced to zero so that the repulsive magnetic force becomes zero. As a result, the wafer carrier 131 is in contact with the wafer chuck 121, and the wafer carrier 131 may rest on the wafer chuck 121 by gravity. Subsequently, the vacuum may be switched from an OFF state to an ON state so as to hold the wafer 141 (and the wafer carrier 131) in place via the first vacuum cavities 123*a*, the second vacuum cavities 123*b* and the third vacuum cavities 133. As a result, fine wafer alignment is locked in by the vacuum for subsequent processing steps such as lithography, film deposition, etching, doping, etc. Additionally, another electrical current can be flowed through the electromagnet in an opposite direction to generate an attractive magnetic force between the wafer carrier 131 and the wafer chuck 121.

Figure 11:
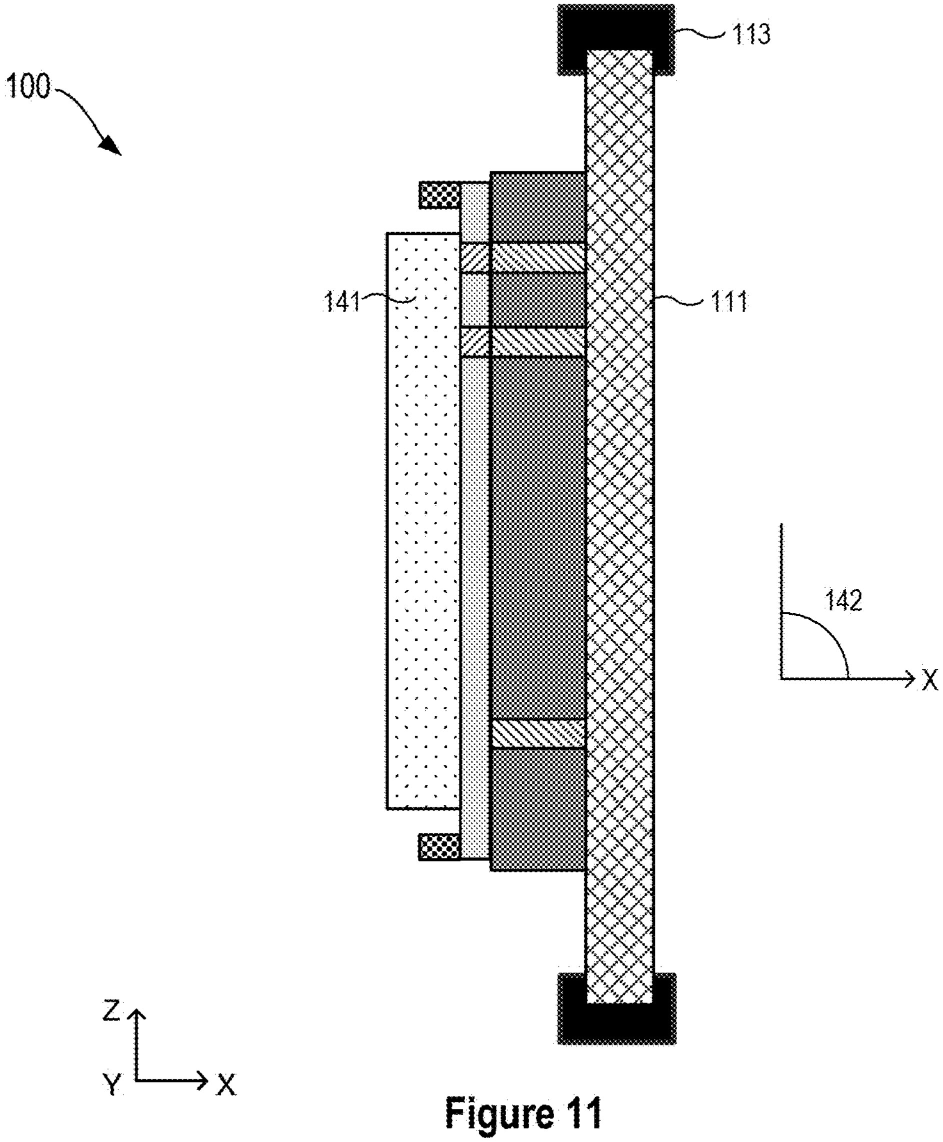

In FIG. 11, the one or more robot grippers 113 can be used to rotate the wafer 141 by any angle (e.g. 90 degrees for vertical processing) so that the wafer 141 is not perpendicular to the gravity direction. An angle 142 is formed between a working surface of the wafer 141 and the +X direction. The angle 142 is not particularly limited and can have any values between 0° and 360°, e.g. 5°, 15°, 30°, 45°, 60°, 75°, 90°, 105°, 120°, 150°, 180°, 210°, 240°, 270°, 300°, 330°, 355° or any values therebetween. The wafer 141 can be rotated clockwise or anticlockwise. Preferably, the wafer 141 can be rotated so that the working surface of the wafer 141 is parallel to the gravity direction along the Y direction with the angle 142 being 90°.

FIGS. 6, 7, 8, 9, 10 and 11 can show embodiments including vertical wafer elevation, horizontal wafer alignment and vertical rotation. FIGS. 6, 7, 8, 9 and 10, without FIG. 11, can show embodiments including vertical wafer elevation and horizontal wafer alignment. FIGS. 6, 7, 8 and 10, without FIGS. 9 and 11, can show embodiments including vertical wafer elevation.

Figure 12:
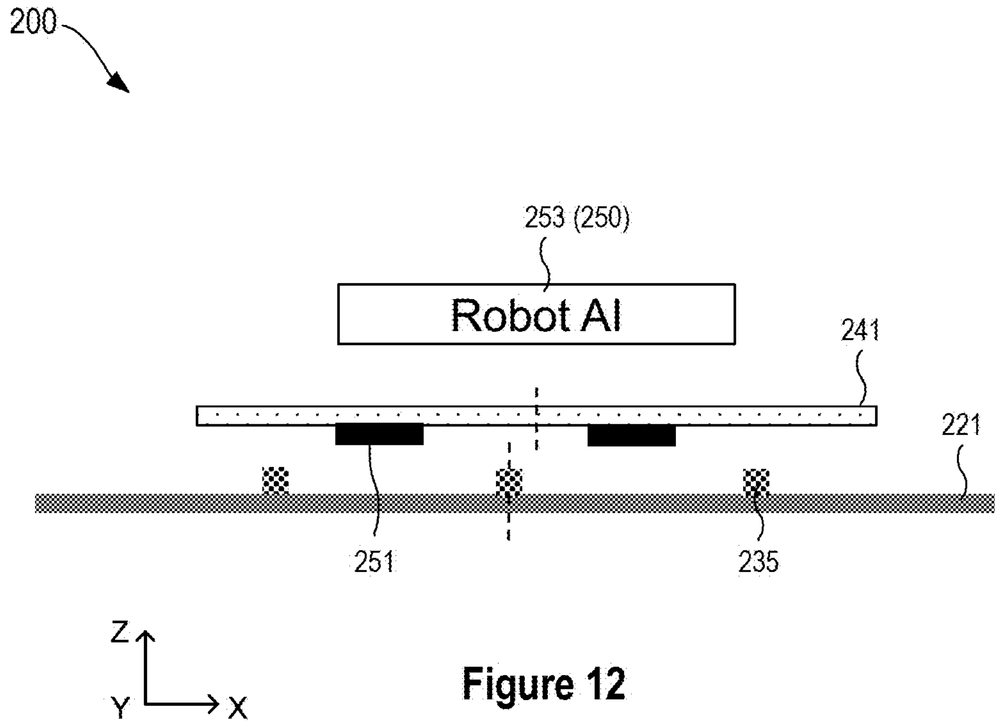
FIGS. 12 and 13 show vertical cross-sectional views of a wafer handling system at various intermediate steps of handling a wafer, in accordance with some embodiments of the present disclosure.
Figure 13:
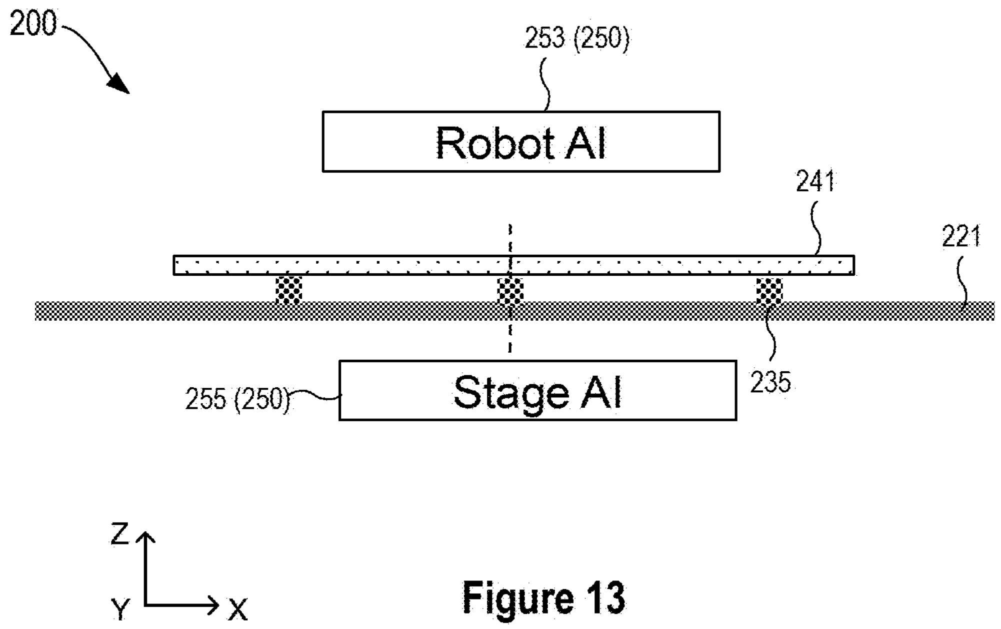

FIGS. 12 and 13 show vertical cross-sectional views of a wafer handling system (hereinafter referred to as a system 200) at various intermediate steps of handling a wafer 241, in accordance with some embodiments of the present disclosure. In FIG. 12, the wafer 241 is misaligned relative to wafer pins 235 on a wafer chuck 221. A robot artificial intelligence (AI) module 253 can be used to control robot grippers 251 to move the wafer 241. The robot grippers 251 with the robot AI module 253 can deliver the wafer 241 above the wafer chuck 221 coupled with continuous wafer alignment sensing to get current misalignment then remain fixed. Alternatively or additionally, a stage AI module 255 can be used to move the wafer chuck 221 for wafer alignment. As a result in FIG. 13, the wafer 241 can be aligned with the wafer pins 235 on the wafer chuck 221. The robot grippers 251 are moved away, and the wafer 241 is moved down to get in contact with the wafer chuck 221.

In one embodiment, the stage AI module 255 is used, with wafer plate (e.g. 221) movement in the lateral (e.g. X, Y) and angular (e.g. θ) directions. That is, the wafer chuck 221 is moved for wafer alignment while the wafer 241 is kept stationary. Specifically, the wafer 241 can be elevated, and then the wafer chuck 221 is transferred or moved using AI robotic movement. Then, continuous sensing of wafer alignment coupled to the continuous wafer plate AI movement software is turned on. Then, the wafer chuck 221 is moved by AI to obtain precision fine alignment, followed by lowering the wafer 241 and removing the robot grippers 251. This embodiment is applicable to various semiconductor processes that benefit from precision fine alignment or alignment corrections.

In another embodiment, the robot AI module 253 is used, with wafer (e.g. 241) movement in the lateral (e.g. X, Y) and angular (e.g. θ) directions. That is, the wafer chuck 221 can be kept stationary while the wafer is moved and/or rotated. Specifically, the wafer 241 is elevated. Then the wafer chuck 221 is transferred using AI robotic movement. Then continuous sensing of wafer alignment coupled to the continuous robotic AI movement software is turned on. Then the robot grippers 251 (e.g. one or more robot arms) coupled to AI are moved to obtain precision fine alignment, followed by lowering the wafer 241 and removing the robot grippers 251. This embodiment is applicable to various semiconductor processes that benefit from precision fine alignment or alignment corrections.

In yet another embodiment, the stage AI module 255 can be used to move the wafer chuck 221 in the lateral (e.g. X, Y) and angular (e.g. θ) directions while the robot AI module 253 used to move the wafer 241 in the lateral (e.g. X, Y) and angular (e.g. θ) directions. Specifically, the wafer 241 is elevated. Then the wafer chuck 221 is transferred using AI robotic movement. Then continuous sensing of wafer alignment coupled to the continuous robotic AI movement software is turned on. Then the robot grippers 251 (e.g. one or more robot arms) coupled to AI are moved to obtain precision fine alignment, followed by lowering the wafer 241 and removing the robot grippers 251. This embodiment is applicable to various semiconductor processes that benefit from precision fine alignment or alignment corrections.

Additionally, the stage AI module 255 and/or the robot AI module 253 can be part of the controller 250 that may optionally be connected to a corresponding memory storage unit and user interface (all not shown). Various wafer handling operations can be executed via the user interface, and various wafer handling recipes and operations can be stored in a storage unit. The controller 250 may be coupled to the robot grippers 251 to receive inputs from and provide outputs to the robot grippers 251. The controller 250 can also be coupled to various sensors and configured to receive sensor data therefrom. The controller 250 can also be configured to adjust knobs and control settings. Of course the adjustments can be manually made as well.

It will be recognized that the controller 250 may be coupled to various components of the process 500 to receive inputs from and provide outputs to the components. For example, the controller 250 can be configured to implement step S530 to adjust wafer alignment and/or step S540 to reduce the electrical current to lower the wafer. Of course, one or more functions of the controller 250 can also be manually accomplished.

The controller 250 can be implemented in a wide variety of manners. In one example, the controller 250 is a computer. In another example, the controller 250 includes one or more programmable integrated circuits that are programmed to provide the functionality described herein. For example, one or more processors (e.g. microprocessor, microcontroller, central processing unit, etc.), programmable logic devices (e.g. complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g. memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of wafer handling, the method comprising:

providing a wafer, a wafer carrier, a wafer chuck and a vacuum plate, wherein the wafer is on the wafer carrier, the wafer carrier is on the wafer chuck, the wafer chuck is on the vacuum plate, the wafer carrier comprises a permanent magnet, the wafer chuck comprises an electromagnet, the wafer chuck comprises a first vacuum cavity and a second vacuum cavity, the wafer carrier comprises a third vacuum cavity;

while a vacuum for the first vacuum cavity, the second vacuum cavity and the third vacuum cavity is off, raising the wafer against a gravity direction by flowing an electrical current through the electromagnet so that the wafer carrier is repelled from the wafer chuck while the wafer remains on the wafer carrier;

while keeping the wafer raised, adjusting wafer alignment by moving the wafer chuck, the wafer carrier or both so that the first vacuum cavity and the third vacuum cavity are aligned with each other; and reducing the electrical current to zero so that the wafer carrier is in contact with the wafer chuck, wherein the wafer is connected to the vacuum plate via the first vacuum cavity and the third vacuum cavity, and the wafer carrier is connected to the vacuum plate via the second vacuum cavity.

2. The method of claim 1, wherein:

the first vacuum cavity and the second vacuum cavity include through-holes that extend through the wafer chuck, and the third vacuum cavity includes a through-hole that extends through the wafer carrier.

3. The method of claim 1, wherein:

an overall area of the first vacuum cavity and the second vacuum cavity in a horizontal plane substantially perpendicular to a thickness direction of the wafer chuck is larger than an overall area of the third vacuum cavity in the horizontal plane.

4. The method of claim 1, wherein:

the first vacuum cavity and the second vacuum cavity are not connected with each other.

5. The method of claim 1, wherein:

the first vacuum cavity and the second vacuum cavity are part of a stripe pattern and connected with each other.

6. The method of claim 1, further comprising:

switching on the vacuum for the first vacuum cavity, the second vacuum cavity and the third vacuum cavity so that the wafer, the wafer carrier, the wafer chuck and the vacuum plate are held together by the vacuum.

7. The method of claim 6, further comprising:

rotating the wafer by a robot gripper so that a working surface of the wafer is not perpendicular to the gravity direction.

8. The method of claim 7, wherein:

the wafer is rotated so that the working surface of the wafer is parallel to the gravity direction.

9. The method of claim 6, further comprising:

flowing another electrical current through the electromagnet so that the wafer carrier is magnetically attracted to the wafer chuck.

10. The method of claim 1, wherein:

the wafer carrier further comprises a dielectric enclosure, and the permanent magnet is embedded in the dielectric enclosure.

11. The method of claim 10, wherein:

the wafer carrier further comprises wafer pins outside the dielectric enclosure.

12. An apparatus for wafer handling, the apparatus comprising:

a wafer chuck comprising an electromagnet and configured to receive a wafer carrier thereon, the wafer carrier comprising a permanent magnet and configured to receive a wafer thereon, wherein the wafer chuck comprises a first vacuum cavity and a second vacuum cavity, and the wafer carrier comprises a third vacuum cavity;

a vacuum plate below the wafer chuck, wherein the wafer is configured to connect to the vacuum plate via the first vacuum cavity and the third vacuum cavity, and the wafer carrier is configured to connect to the vacuum plate via the second vacuum cavity; and a controller that is configured to, while a vacuum for the first vacuum cavity, the second vacuum cavity and the third vacuum cavity is off, raise the wafer against a gravity direction by flowing an electrical current through the electromagnet so that the wafer carrier is repelled from the wafer chuck while the wafer remains on the wafer carrier.

13. The apparatus of claim 12, wherein:

the first vacuum cavity and the second vacuum cavity include through-holes that extend through the wafer chuck, and the third vacuum cavity includes a through-hole that extends through the wafer carrier.

14. The apparatus of claim 12, wherein:

an overall area of the first vacuum cavity and the second vacuum cavity in a horizontal plane substantially perpendicular to a thickness direction of the wafer chuck is larger than an overall area of the third vacuum cavity in the horizontal plane.

15. The apparatus of claim 12, wherein:

the first vacuum cavity and the second vacuum cavity are not connected with each other.

16. The apparatus of claim 12, wherein:

the first vacuum cavity and the second vacuum cavity are part of a stripe pattern and connected with each other.

17. The apparatus of claim 12, wherein:

the wafer carrier further comprises a dielectric enclosure, and the permanent magnet is embedded in the dielectric enclosure.

18. The apparatus of claim 17, wherein:

the wafer carrier further comprises wafer pins outside the dielectric enclosure.

19. The apparatus of claim 12, further comprising:

a robotic gripper that is configured to rotate the wafer so that a working surface of the wafer is not perpendicular to the gravity direction.

20. The apparatus of claim 12, wherein:

the controller is further configured to move the wafer chuck to adjust wafer alignment while keeping the wafer raised, before reducing the electrical current to lower the wafer along the gravity direction.

* * * * *